(12) United States Patent
Uchiyama

(10) Patent No.: US 7,323,785 B2
(45) Date of Patent: Jan. 29, 2008

(54) SEMICONDUCTOR DEVICE

(75) Inventor: Shiro Uchiyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 21 days.

(21) Appl. No.: 11/377,574

(22) Filed: Mar. 17, 2006

(65) Prior Publication Data

US 2006/0220182 A1 Oct. 5, 2006

(30) Foreign Application Priority Data

Mar. 17, 2005 (JP) ............................. 2005-077050

(51) Int. Cl.
*H01L 29/40* (2006.01)
(52) U.S. Cl. ............... 257/774; 257/773; 257/E21.575; 257/E21.597; 257/E23.175; 438/637; 438/621
(58) Field of Classification Search ............... 257/129, 257/181, 621, 686, E23.085, E23.174, E23.175, 257/773, E21.575, E21.597, 774; 438/637, 438/621

See application file for complete search history.

(56) References Cited

U.S. PATENT DOCUMENTS

| 7,157,372 | B1 * | 1/2007 | Trezza | 438/675 |
| 2006/0001174 | A1 * | 1/2006 | Matsui | 257/774 |
| 2006/0006539 | A1 * | 1/2006 | Matsui et al. | 257/758 |
| 2006/0118965 | A1 * | 6/2006 | Matsui | 257/774 |
| 2006/0278995 | A1 * | 12/2006 | Trezza | 257/777 |

FOREIGN PATENT DOCUMENTS

| JP | 2002-289623 | 10/2002 |
| JP | 2003-17558 | 1/2003 |

* cited by examiner

*Primary Examiner*—Minhloan Tran
*Assistant Examiner*—Eric A Bomkamp
(74) *Attorney, Agent, or Firm*—Young & Thompson

(57) ABSTRACT

A through-electrode that penetrates a semiconductor substrate and that is insulatively separated from the semiconductor substrate includes an inner through-electrode, a quadrangular ring-shaped semiconductor, and an outer peripheral through-electrode. The quadrangular ring-shaped semiconductor is formed around the inner through-electrode, and the outer peripheral through-electrode is formed around the quadrangular ring-shaped semiconductor.

19 Claims, 8 Drawing Sheets

SEMICONDUCTOR DEVICE

This application claims priority to prior application JP 2005-77050, the disclosure of which is incorporated herein by reference.

BACKGROUND OF THE INVENTION

1. Field of the Invention

The present invention relates to a semiconductor device, and in particular, to a three-dimensional semiconductor device having a through-electrode, the device being formed by stacking a plurality of semiconductor chips.

2. Description of the Related Art

In recent years, three-dimensional semiconductor devices formed by stacking a plurality of semiconductor chips has been proposed. This type of a three-dimensional semiconductor device establishes electrical continuity between semiconductor chips by through-electrodes that penetrate semiconductor substrates.

FIGS. 1 and 2 are each a sectional view of a conventional three-dimensional semiconductor device. The three-dimensional semiconductor device in FIG. 1 has three semiconductor chips 3, 4, and 5 mounted on a support substrate 1. Each of the semiconductor chips has through-electrodes 7 that penetrate the semiconductor substrate. The semiconductor chips 3, 4, and 5 are connected to one another by bumps 6 connected to the through-electrodes 7, and further connected to wiring pattern 2 on the support substrate 1. FIG. 2 is a sectional view of another example of a through-electrode 7. This through-electrode 7 comprises a through conducting layer 7a penetrating a semiconductor substrate 11, and a through-electrode insulating layer 7b. Each semiconductor chip includes connection wiring 16 for connecting the through-electrode 7, and a protective insulating layer 17. The semiconductor chips are connected to each other by a bump (not shown) in the connection wiring 16.

For making the through-electrode, holes with a diameter of several tens of micrometers are formed into the semiconductor substrate, and after a through-electrode insulating layer 7b for ensuring insulation property of side walls and the semiconductor substrate has been formed to a thickness of about several hundreds nm to several micrometers, the holes are filled in with the through conducting layer 7a. Thereafter, the through conducting layer 7a and the through-electrode insulating layer 7b are flattened so as to be flush with semiconductor substrate 11, and by a production process similar to that for an ordinary semiconductor device, a semiconductor device is produced. The layer thickness of the through-electrode insulating layer 7b surrounding the through conducting layer 7a has influences not only upon the ensuring of an insulation property, but also upon the capacity value between the substrate and the through-electrode. Therefore, the layer thickness of the through-electrode insulating layer 7b must be large enough to satisfy both of the insulation property and capacity value.

The through-electrode is caused to penetrate the semiconductor substrate with a thickness on the order of 100 μm. As a consequence, the capacity between the semiconductor substrate and the through-electrode becomes large so that high-frequency waveforms are disturbed during high-frequency data transfer, thereby raising a problem of inhibiting a high-speed data transfer. In order to reduce this capacity. It may be necessary to deposit a layer having a thickness on the order of as thick as several tens of micrometers, as an insulation layer. In the conventional art, the capacity between the semiconductor substrate 11 and the through-electrode 7 depends on the thickness of the through-electrode insulating layer and dielectric constant. Therefore, in order to reduce the capacity, the layer thickness must be increased in the conventional art.

On the other hand, in order to fill in holes for the through-electrode with a conducting layer of a diameter of several tens of micrometers, it is necessary to deposit a conducting layer having a thickness of half the hole diameter or more. As a result, the filling-in time of the conducting layer becomes long, thereby causing a problem of increasing a load in the production process. Furthermore, in case where a conducting layer of a thickness of several tens of micrometers is deposited, grains subjected to the deposition become more nonuniform as the layer thickness increases, thereby resulting in varied characteristics among the grains. Consequently, it is difficult to deposit a conducting layer with a uniform layer quality.

Regarding the through-electrode, for example, Japanese Unexamined Patent Application Publication No. 2003-017558 discloses a through-electrode of which a conducting layer has no hollow. According to its forming method for a through-electrode, after holes having a diameter of several tens of micrometers are formed into a semiconductor substrate, the holes are filled in with a coated insulating layer, and then a conducting layer is deposited on the holes formed by again etching. Also, Japanese Unexamined Patent Application Publication No. 2002-289623 discloses a semiconductor device in which a short circuit is prevented by providing a second insulating region outside a through-electrode. These patent documents, however, cannot provide a through-electrode that is small in capacity between the semiconductor substrate and the through-electrode, and that has a conducting layer with a uniform layer quality. Thus, the above-described problems have not still unsolved.

As described above, the through-electrode used for a three-dimensional semiconductor device involves two basic problems, i.e., a problem that the large capacity occurring between the semiconductor substrate and the through-electrode inhibits high-speed data transfer, and a problem that the large thickness of a conducting layer increases the deposition time of a filled-in conducting layer and makes nonuniform the layer quality of the filled-in conducting layer.

SUMMARY OF THE INVENTION

It is therefore an object of the present invention to provide a through-electrode that is small in capacity between the through-electrode and the semiconductor substrate and short in the falling-in time of a conducting layer and that comprises a conducting layer with an uniform layer quality, and to a semiconductor device with this through-electrode, capable of high-speed data transfer.

According to one aspect of the present invention, there is provided a through-electrode that penetrates a semiconductor substrate and that is insulatively separated from the semiconductor substrate, the through-electrode comprising:

an inner through-electrode;
a quadrangular ring-shaped semiconductor; and
an outer peripheral through-electrode, wherein the quadrangular ring-shaped semiconductor is formed around the inner through-electrode, and the outer peripheral through-electrode is formed around the quadrangular ring-shaped semiconductor.

Preferably, each of the quadrangular ring-shaped semiconductor and the outer peripheral through-electrode are in such a floating state that no potential is supplied.

Preferably, the inner through-electrode, the quadrangular ring-shaped semiconductor, and the outer peripheral through-electrode are insulatively separated from one another by insulating layers.

Preferably, the inner through-electrode includes a columnar semiconductor and an inner through conducting layer;

the columnar semiconductor has a square or rectangular cross-sectional shape;

the columnar semiconductor is arranged with the same spacing between opposing sides of the quadrangular ring-shaped semiconductor and the columnar semiconductor; and the spaces between the opposing sides of the quadrangular ring-shaped semiconductor and the columnar semiconductor are filled in with the inner through conducting layer.

Preferably, the inner through-electrode includes a plurality of columnar semiconductors and an inner through conducting layer;

each of the columnar semiconductors has a square or rectangular cross-sectional shape;

the columnar semiconductors are arranged with the same spacing between opposing sides of the quadrangular ring-shaped semiconductor and the columnar semiconductors and between the adjacent columnar semiconductors; and the spaces between the opposing sides of the quadrangular ring-shaped semiconductor and the columnar semiconductors and between the adjacent columnar semiconductors are filled in with the inner through conducting layer.

Preferably, the columnar semiconductor is insulatively separated from the inner through conducting layer by an inner through-electrode insulating layer.

Preferably, the quadrangular ring-shaped semiconductor is insulatively separated from the inner through conducting layer by the inner through-electrode insulating layer, and insulatively separated from the outer peripheral through conducting layer by the outer peripheral through-electrode insulating layer.

Preferably, the outer peripheral through-electrode includes the outer peripheral through conducting layer and the outer peripheral through-electrode insulating layer, and is insulatively separated from the quadrangular ring-shaped semiconductor and the semiconductor substrate by the outer peripheral through-electrode insulating layer.

Preferably, a thickness of each of the outer peripheral through conducting layer and the outer peripheral through-electrode insulating layer that constitute the outer peripheral through-electrode, is smaller than a thickness of the respective one of the inner through conducting layer and the inner through-electrode insulating layer that constitute the inner through-electrode.

Preferably, the through-electrode further comprises at least one outer peripheral layer arranged outside the outer peripheral through-electrode, the at least one outer peripheral layer including a quadrangular ring-shaped semiconductor and an outer peripheral through-electrode.

Preferably, the inner through-electrode is connected to a bump directly, or indirectly via connection wiring.

According to another aspect of the present invention, there is provided a semiconductor device formed by stacking semiconductor chips, each of the semiconductor chips comprising:

an inner through-electrode that penetrates a semiconductor substrate;

a quadrangular ring-shaped semiconductor formed around the inner through-electrode, and an outer peripheral through-electrode formed around the outer periphery of the quadrangular ring-shaped semiconductor.

Preferably, each of the quadrangular ring-shaped semiconductor and the outer peripheral through-electrode are in such a floating state that no potential is supplied.

Preferably, the inner through-electrode includes a plurality of columnar semiconductors and an inner through conducting layer, and is insulatively separated from the quadrangular ring-shaped semiconductor by an inner through-electrode insulating layer.

Preferably, the plurality of columnar semiconductors is arranged with the same spacing between opposing sides of the quadrangular ring-shaped semiconductor and the columnar semiconductors or between the adjacent columnar semiconductors; and wherein the spaces between the opposing sides of the quadrangular ring-shaped semiconductor and the columnar semiconductors and between the adjacent columnar semiconductors are filled in with the inner through conducting layer.

Preferably, each of the columnar semiconductors is insulatively separated from the inner through conducting layer by the inner through-electrode insulating layer.

Preferably, the semiconductor device further comprises at least one outer peripheral layer arranged outside the outer peripheral through-electrode, the at least one outer peripheral layer including a quadrangular ring-shaped semiconductor and an outer peripheral through-electrode.

Preferably, the inner through-electrode is connected to a bump directly, or indirectly via connection wiring; and wherein the semiconductor chips are stacked by the bump.

The through-electrode according to the present invention comprises an inner through-electrode, and an outer peripheral layer having a quadrangular ring-shaped semiconductor and an outer peripheral through-electrode provided around the outer periphery of the inner through-electrode. The inner through-electrode can be formed of a thin conducting layer by having therein equally-spaced columnar semiconductors. Furthermore, by bringing the outer peripheral layer into a floating state, the capacity generated between the semiconductor substrate and the inner through-electrode can be dramatically reduced. With this structure, it is possible to obtain a semiconductor device that is small in the capacity value, short in the filling-in time of the conducting layer, and easily producible. Thus, a three-dimensional through-electrode with this through-electrode, capable high-speed data transfer can be obtained.

DESCRIPTION OF THE PREFERRED EMBODIMENTS

Hereinafter, embodiments according to the present invention will be described with reference to accompanying drawings.

First Embodiment

Figure 1:
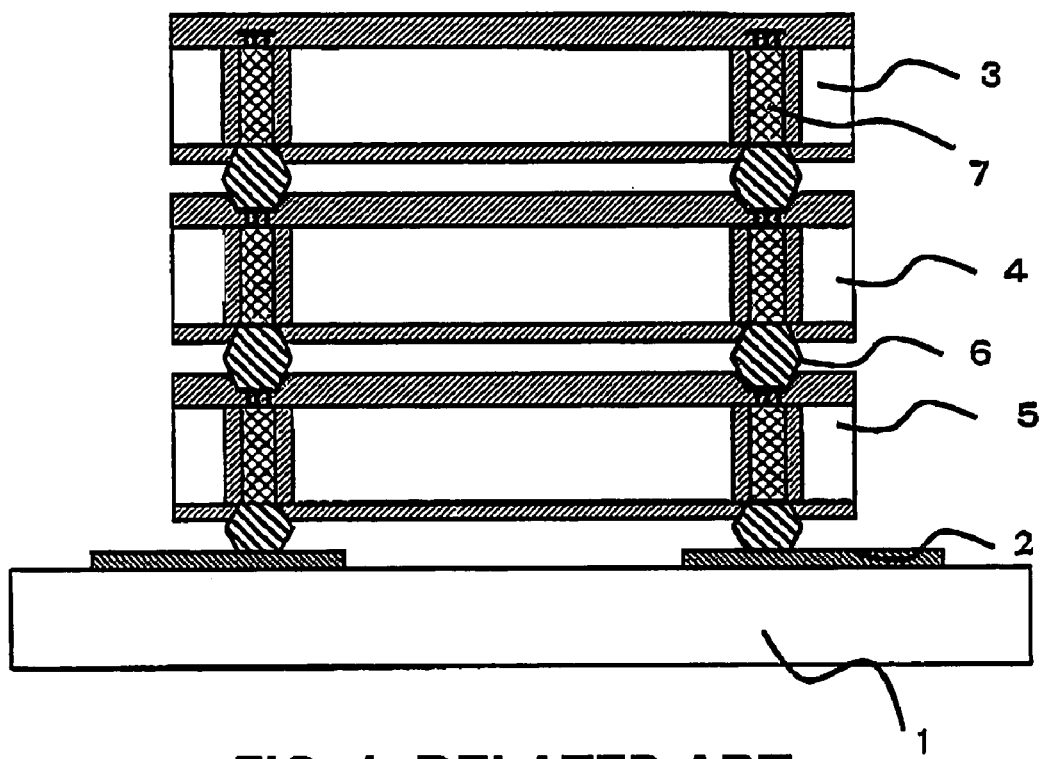
FIG. 1 is a sectional view of a three-dimensional semiconductor device according to a conventional example.
Figure 2:
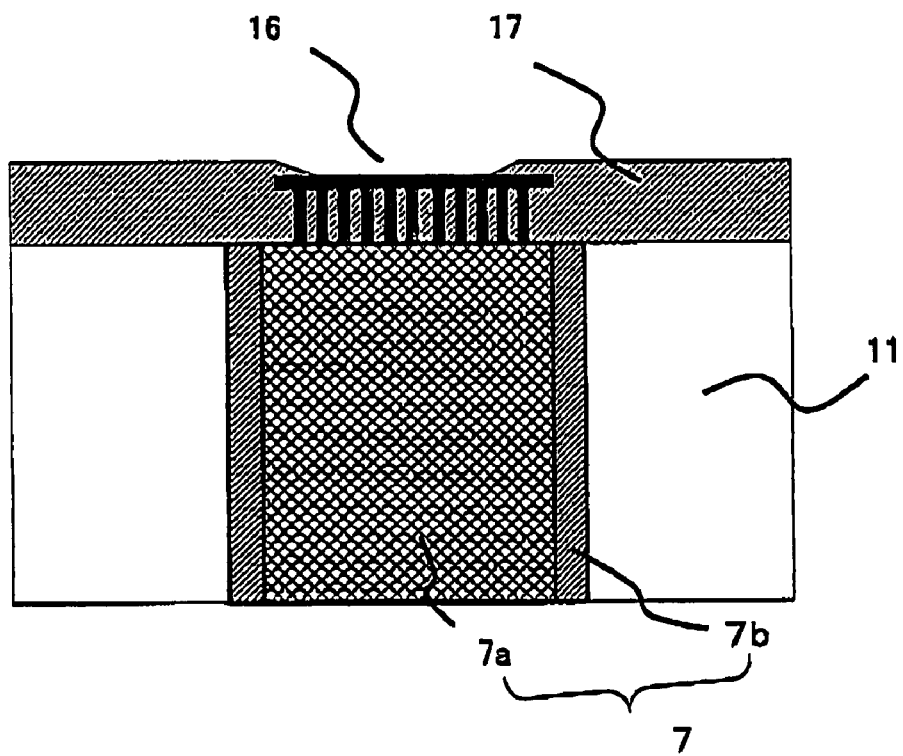
FIG. 2 is a sectional view of a through-electrode according to another conventional example.
Figure 3:
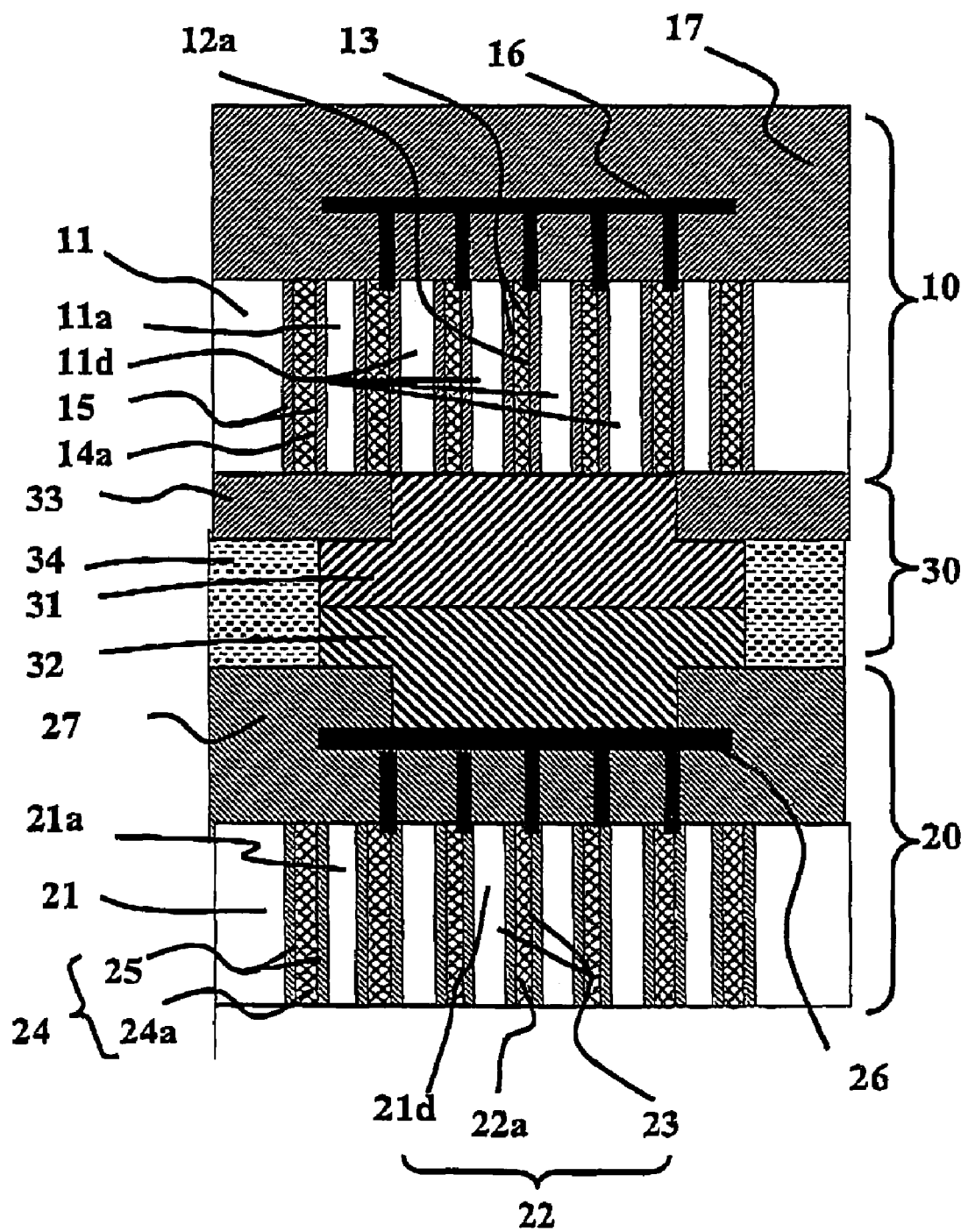
FIG. 3 is a sectional view of a three-dimensional semiconductor device according to the present invention.
Figure 4:
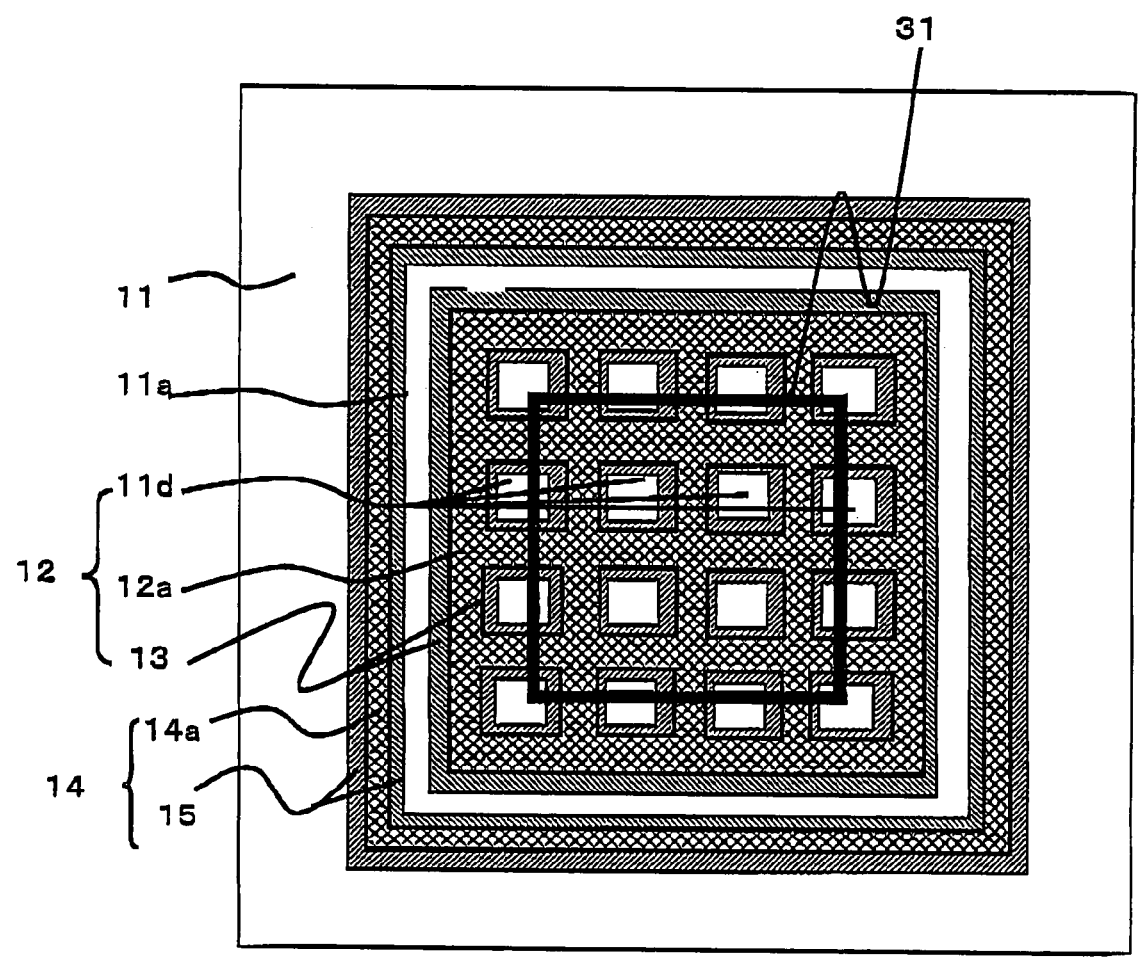
FIG. 4 is a plan view of a through-electrode having an outer peripheral layer in the present invention.
Figure 5:
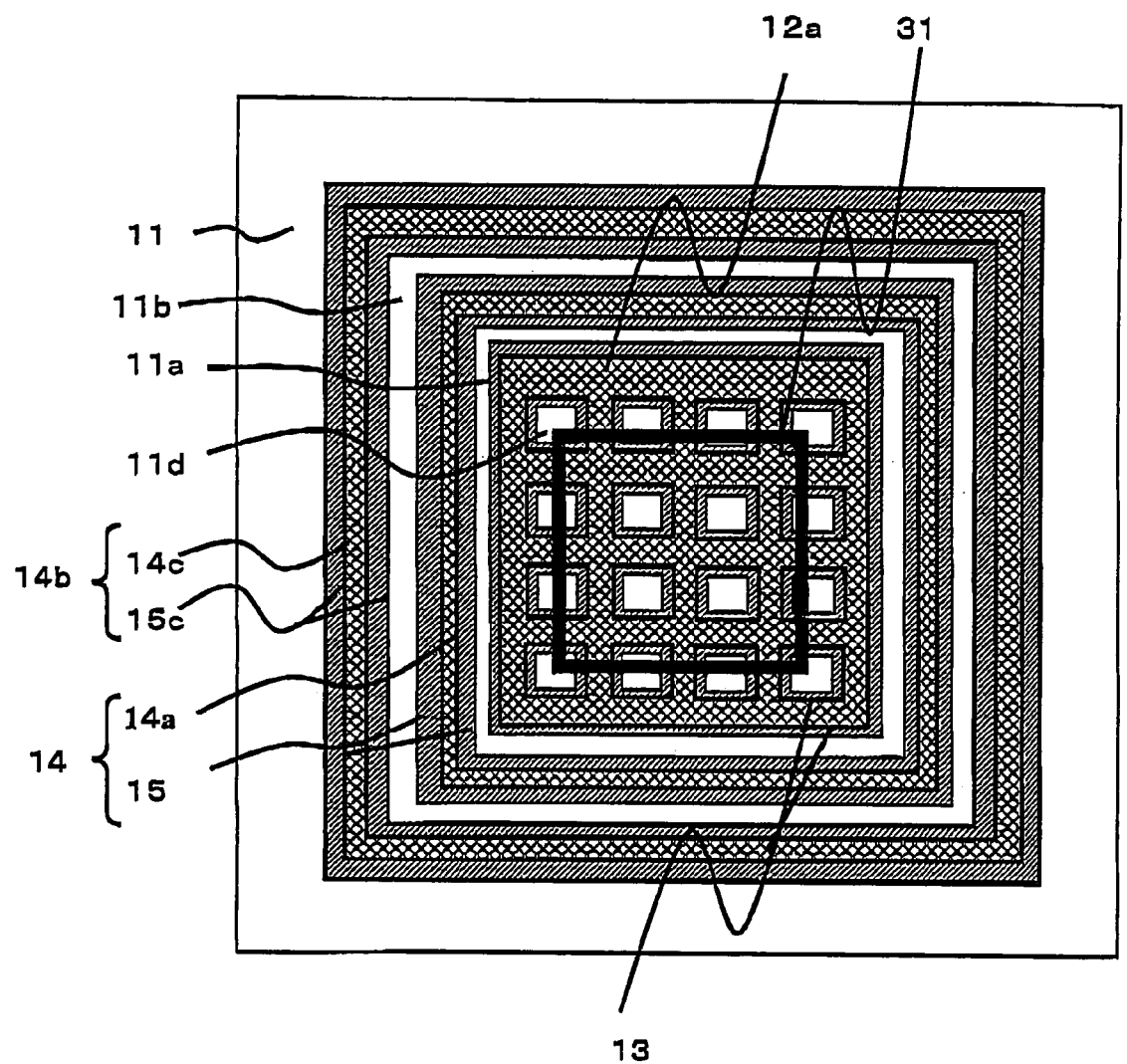
FIG. 5 is a plan view of a through-electrode having a dual outer peripheral layer in the present invention.
Figure 6:
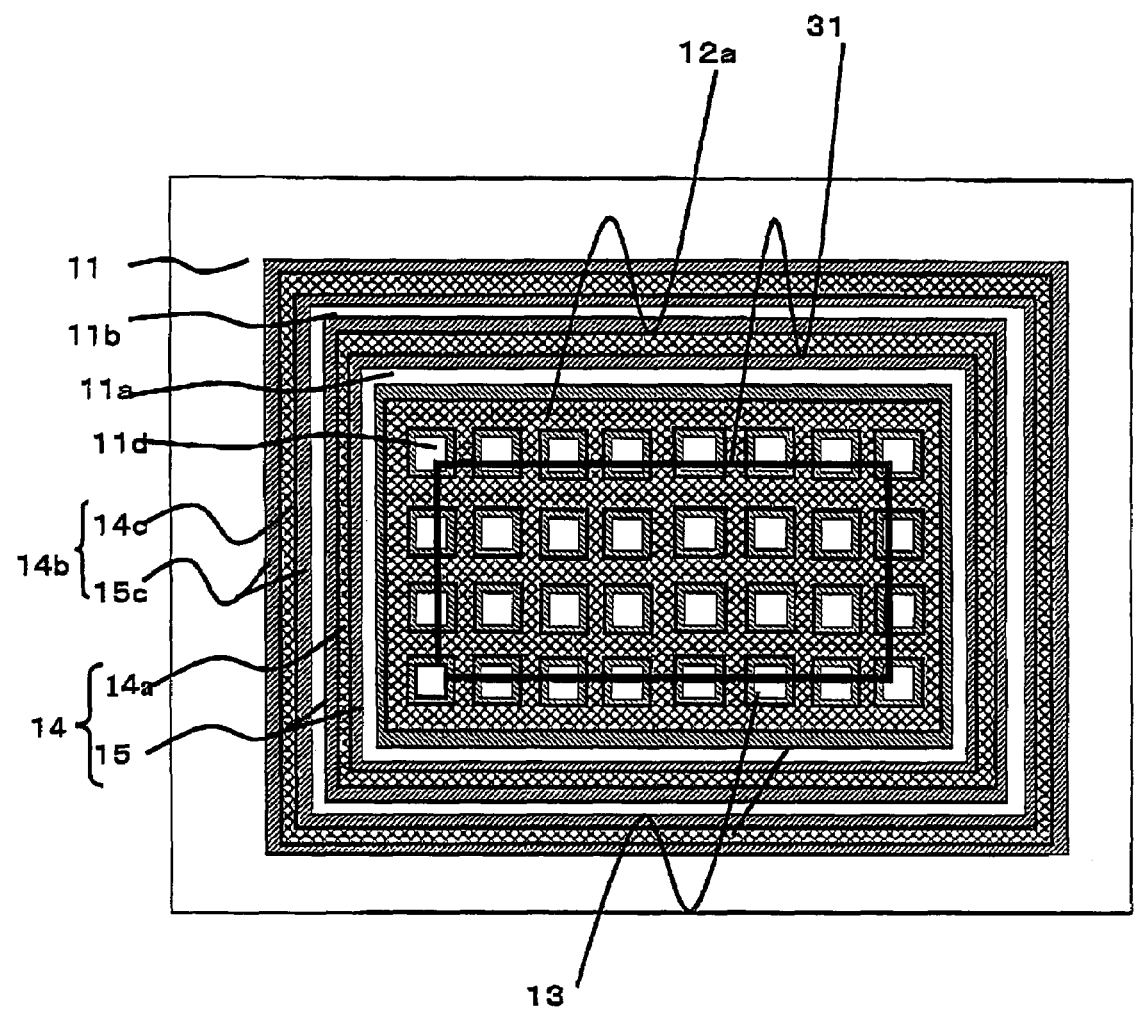
FIG. 6 is a plan view of another through-electrode having a dual outer peripheral layer in the present invention.
Figure 7:
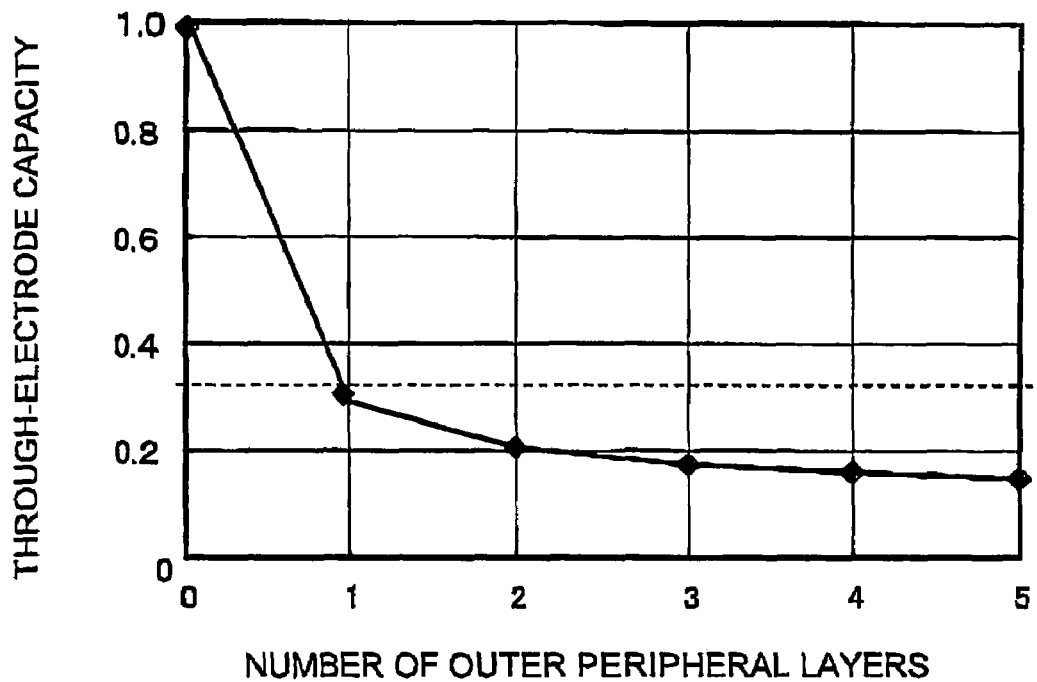
FIG. 7 is a graph showing the dependence of the through-electrode capacity upon the number of outer peripheral layers.
Figure 8:
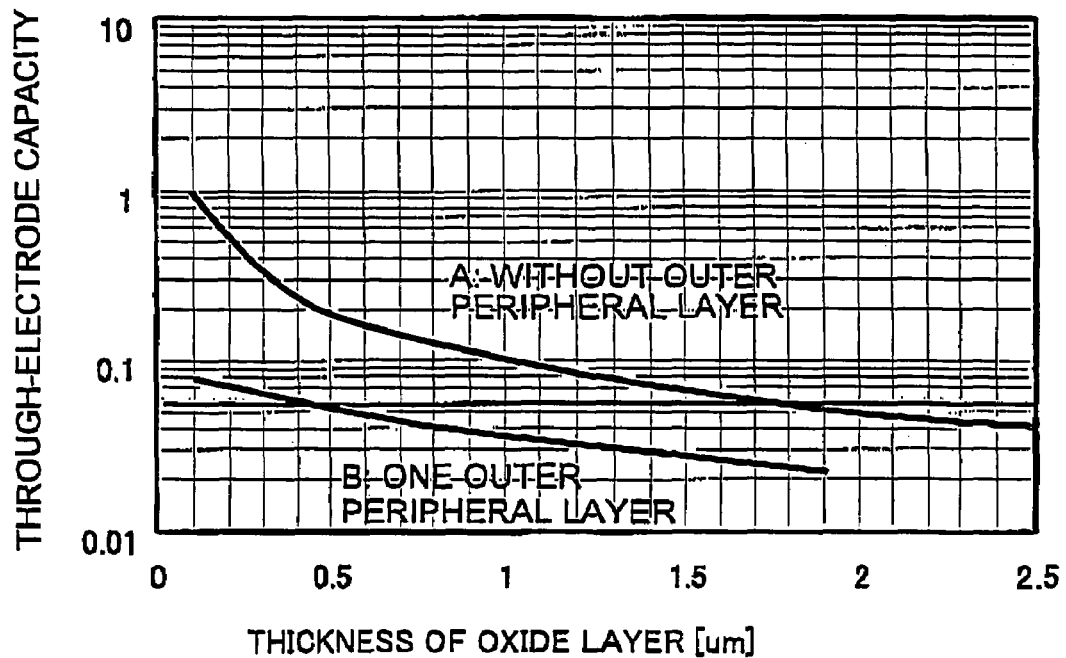
FIG. 8 is a graph showing the dependence of the through-electrode capacity upon the thickness of oxide layer, in the presence and absence of an outer peripheral layer.

A three-dimensional semiconductor device according to the present invention will be described as a first embodiment thereof, with reference to FIGS. 3 to 8. Here, FIG. 3 is a sectional view of a three-dimensional semiconductor device according to the present invention. FIG. 4 is a plan view of a through-electrode having an outer peripheral layer in the present invention. FIG. 5 is a plan view of a through-electrode having a dual peripheral layer in the present invention. FIG. 6 is a plan view of another through-electrode having a dual peripheral layer in the present invention. FIG. 7 is a graph showing the dependence of the through-electrode capacity upon the number of outer peripheral layers. FIG. 8 is a graph showing the dependence of the through-electrode capacity upon the thickness of an oxide layer, in the presence and absence of an outer peripheral layer.

FIG. 3 is a sectional view of a through-electrode connection portion 30 in which a semiconductor chip 10 and a semiconductor chip 20 are connected. The semiconductor chip 10 comprises a semiconductor substrate 11, an inner through conducting layer 12a, an inner through-electrode insulating layer 13, a plurality of columnar semiconductors 11d, a quadrangular ring-shaped semiconductor 11a, an outer peripheral through conducting layer 14a, an outer peripheral through-electrode insulating layer 15, connection wiring 16, insulating layers 17 and 33, and a bump 31. Likewise, the semiconductor chip 20 comprises a semiconductor substrate 21, an inner through conducting layer 22a, an inner through-electrode insulating layer 23, a plurality of columnar semiconductors 21d, a quadrangular ring-shaped semiconductor 21a, an outer peripheral through conducting layer 24a, an outer peripheral through-electrode insulating layer 25, connection wiring 26, an insulating layer 27, and a bump 32.

The semiconductor chip 10 at the upper stage includes an inner through-electrode 12 penetrating the semiconductor substrate 11, and the bump 31 formed on the rear surface side of the semiconductor substrate 11. On the other hand, the semiconductor chip 20 at the lower stage includes an inner through-electrode 22 penetrating the semiconductor substrate 21, and the bump 32 formed on the surface side of the semiconductor substrate 21. The two semiconductor chips 10 and 20 are connected by connecting the bumps 31 and 32. Furthermore, the spacing between the two semiconductor chips is filled in with a resin adhesive 34 for use in holding. In this situation, the outer peripheral through-electrode 14, the quadrangular ring-shaped semiconductor 11a, the outer peripheral through-electrode 24, and the quadrangular ring-shaped semiconductor 21a are each in a floating state, in which they are connected to no element nor wiring. On the surface of the semiconductor chips 10 and 20, semiconductor elements such as transistors and wiring layers are formed (these semiconductor elements are not shown). These wiring layers may be wired to the connection wiring 16 or the connection wiring 26.

Referring to FIG. 4 also, description will be made of the structure of the through-electrode. The through-electrode according to the present invention includes the inner through-electrode 12 and the outer peripheral through-electrode 14. The inner through-electrode 12 further includes therein the plurality of columnar semiconductors 11d, and is formed of the inner through conducting layer 12a and the inner through-electrode insulating layer 13, which fill in the spaces between the quadrangular ring-shaped semiconductor 11a and the columnar semiconductors 11d. The columnar semiconductors 11d are insulated from the inner through conducting layer 12a by the inner through-electrode insulating layer 13. Herein, the columnar semiconductors 11d are arranged with the same spacing between the opposing sides of the quadrangular ring-shaped semiconductor and the columnar semiconductors and between the adjacent columnar semiconductors. On the top surface of the inner through conducting layer 12a, an insulating layer for protecting the semiconductor chip is formed, and the insulating layer on the inner through conducting layer 12a is partially opened. A bump 31 is formed on the opening portion, which is connected to the outside. FIG. 4 shows a region where the insulating layer is opened and the bump 31 is formed, as the bump 31.

The columnar semiconductors 11d are arranged with the equal spacings, and the width of the region to be the outer peripheral through-electrode is made equal to or smaller than the above-described spacing. The equalization of the spacings brings about an advantage of uniformly filling in the spaces between the columnar semiconductors, with a thin layer, upon depositing the conducting layer of the through-electrode. When the inside of the inner through-electrode having a size of several tens of micrometers per side is filled in with a conducting layer, a layer with a thickness of half the diameter or more of its hole must be deposited. However, in the present invention, the inside of the inner through-electrode is divided into equally-spaced columnar semiconductors, and if, in FIG. 4, columnar semiconductors of a square 2 µm per side are arranged in an array of four rows and four columns in a square 30 µm per side, and the thickness of an insulating layer is 0.1 µm, then, it is possible to fill in the inner through-electrode with a conducting layer of a thickness of about 2 µm or more. As compared with a layer thickness of 15 µm or more used in the case in which the inside of the inner through-electrode is not divided by columnar semiconductors, the layer thickness used in the present case is advantageously reduced by a factor of 7.

Because of the ability of filling in the inner through-electrode with such a thin layer, the filling-in time of the conducting layer in a production process becomes shorter, and load in production line becomes lighter. In addition, the small layer thickness brings about an advantage of providing a uniform layer quality. Further, since the columnar semiconductors are arranged at equal spacings, it is preferable that they each have a square or rectangular cross-sectional shape. The number of columnar semiconductor (semiconductors) to be arranged is not limited; either a single or a plurality of columnar semiconductors may be adopted. Also, the reduction in the size of columnar semiconductor decreases the area in which columnar semiconductor is to be formed and increases the ratio of the region in which a conducting layer is formed, In this manner, a columnar semiconductor with a lower resistance can be obtained.

The outer peripheral through-electrode 14 comprises the outer peripheral through conducting layer 14*a* and the outer peripheral through-electrode insulating layer 15, and is disposed outside the quadrangular ring-shaped semiconductor 11*a* that surrounds the inner through-electrode 12. Specifically, the through-electrode is structured so that, with the inner through-electrode 12 at the core, the quadrangular ring-shaped semiconductor 11*a* is provided around this inner through-electrode 12, and further the outer peripheral through-electrode 14 is provided around the outer periphery of the quadrangular ring-shaped semiconductor 11*a*. The quadrangular ring-shaped semiconductor 11*a* is separated from the semiconductor substrate 11 by the outer peripheral through-electrode insulating layer 15. The outer peripheral through conducting layer 14*a* is insulated from the quadrangular ring-shaped semiconductor 11*a* and the semiconductor substrate 11 by the outer peripheral through-electrode insulating layer 15. The outer peripheral through-electrode 14 and the quadrangular ring-shaped semiconductor 11*a* are brought into a floating state, in which they are connected to no wiring. Since the outer peripheral through-electrode 14 is in a floating state and does not work as an electrode, it can be formed as the outer peripheral through-electrode insulating layer 15 in its entirety, instead of forming the outer peripheral through conducting layer 14*a*.

With the above-mentioned structure, the inner through-electrode insulating layer 13, the quadrangular ring-shaped semiconductor 11*a*, the outer peripheral through-electrode insulating layer 15, and the outer peripheral through-electrode 14 function as a guard ring between the semiconductor substrate 11 and the inner through-electrode 12. This allows a dramatic reduction in the capacity generated between the inner through-electrode 12 and the semiconductor substrate 11. Furthermore, by virtue of the reduction in the capacity occurring between the inner through-electrode 12 and the semiconductor substrate 11, the layer thickness of each of the inner through-electrode insulating layer 13 and the outer peripheral through-electrode insulating layer 15 can be reduced by a factor of 3 or more relative to a respective one of the conventional insulating layer thicknesses, within the range in which the withstand voltage of each of those insulating layers 13 and 15 can be allowed.

The through-electrode in FIG. 4 comprises the inner through-electrode 12 formed inside the semiconductor substrate 11, the quadrangular ring-shaped semiconductor 11*a*, and the outer peripheral through-electrode 14. Furthermore, inside the inner through-electrode 12, the columnar semiconductors 11*d* are arranged at equal spacings. Equalizing the spacings between the adjacent columnar semiconductors 11*d* allows spaces to be the inner through-electrode 12 to be filled-in with the inner through conducting layer 12*a* having a small layer thickness. The small layer thickness of the conducting layer reduces the filling-in time of a conducting layer in the production process, and makes the quality of a deposited layer more uniform. Moreover, between the semiconductor substrate 11 and the inner through-electrode 12, there are provided the quadrangular ring-shaped semiconductor 11*a* and the outer peripheral through-electrode 14 that are each in a floating state. By bringing each of the quadrangular ring-shaped semiconductor 11*a* and the outer peripheral through-electrode 14 into a floating state, the capacity occurring between the inner through-electrode 12 and the semiconductor substrate 11 can be dramatically reduced. The reduction in the capacity allows high-speed data transfer and an achievement of a through-electrode having an easily producible structure.

FIG. 5 shows a through-electrode having a structure developed from the through-electrode shown in FIG. 4. The through-electrode in FIG. 5 is an example that has a dual outer peripheral layer by being further provided with a quadrangular ring-shaped semiconductor 11*b* and an outer peripheral through-electrode 14*b* outside the quadrangular ring-shaped semiconductor 11*a* and the outer peripheral through-electrode 14.

The structures of the inner through-electrode 12, the quadrangular ring-shaped semiconductor 11*a*, the outer peripheral through-electrode 14, and the bump 31 for use in external connection are the same as those in FIG. 4. In FIG. 5, the same components as in FIG. 4 are designated by the same reference numerals, and descriptions thereof are omitted. In FIG. 5, outside the structure shown in FIG. 4, the second quadrangular ring-shaped semiconductor 11*b* and the second outer peripheral through-electrode 14*b* are further formed. The second outer peripheral through-electrode 14*b* comprises the outer peripheral through conducting layer 14*c* and the outer peripheral through-electrode insulating layer 15*c*, and are insulatively separated from the semiconductor substrate 11 and the quadrangular ring-shaped semiconductor 11*b* by the outer peripheral through-electrode insulating layer 15*c*. These second outer peripheral through-electrode 14*b* and quadrangular ring-shaped semiconductor 11*b* are brought into a floating state, in which they are connected to no wiring.

Herein, with a quadrangular ring-shaped semiconductor and an outer peripheral through-electrode taken as one unit, the region comprising the quadrangular ring-shaped semiconductor 11*a* and the outer peripheral through-electrode 14 is referred to as the first outer peripheral layer, while the region comprising the quadrangular ring-shaped semiconductor 11*b* and the outer peripheral through-electrode 14*b* is referred to as the second outer peripheral layer. With such a structure, the quadrangular ring-shaped semiconductor 11*a*, the outer peripheral through-electrode 14, the quadrangular ring-shaped semiconductor 11*b*, and the outer peripheral through-electrode 14*b* function as a guard ring between the semiconductor substrate 11 and the inner through-electrode 12. This structure is one in which the quadrangular ring-shaped semiconductor 11*b* and the outer peripheral through-electrode 14*b* are added to the structure shown in FIG. 4, as a further guard ring. As a result, the capacity occurring between the inner through-electrode 12 and the semiconductor substrate 11 can be further reduced.

FIG. 6 shows a through-electrode obtained by further modifying the through-electrode in FIG. 5. The region in which the inner through-electrode 12 in FIG. 5 is formed, is a square in cross section, and columnar semiconductors 11*d* are arranged inside the region. On the other hand, the region in which the inner through-electrode 12 in FIG. 6 is formed, is a rectangular shape in cross-section, and the columnar semiconductors 11*d* are arranged inside the region. The inside of each of these regions is filled in with an inner through conducting layer 12*a*.

The structures of the inner through-electrode 12, the quadrangular ring-shaped semiconductor 11*a*, the outer peripheral through-electrode 14, the second quadrangular ring-shaped semiconductor 11*b*, the second outer peripheral through-electrode 14*b*, and the bump 31 for use in external connection are the same as those in FIG. 5. In FIG. 6, the same components as those in FIG. 5 are designated by the same reference numerals, and description thereof is omitted, As shown in FIG. 6, this example is structured so that the cross-sectional shape of the inner through-electrode 12 is a rectangular shape, and that the array of the columnar semiconductors 11d is changed. In this case also, the spacings between adjacent columnar semiconductors 11d arranged inside the inner through-electrode 12 are equalized. The equalization of the spacings allows these spaces to be uniformly filled-in with the inner through conducting layer 12a. By making the cross-sectional shape of inner through-electrode 12 a rectangular shape, the quadrangular ring-shaped semiconductor 11a, the outer peripheral through-electrode 14, the second quadrangular ring-shaped semiconductor 11b, and the second outer peripheral through-electrode 14b that surround the inner through-electrode 12 are also changed in shape.

In FIG. 6, although the cross-sectional shape of the columnar semiconductors 11d is a square, a rectangular shape may also be used. That is, the shape of the columnar semiconductors 11d is not limited, as long as the shape of the columnar semiconductors 11d is one that is formed so that the spacings between the adjacent columnar semiconductors are nearly equal in order to uniformly fill in the spaces with a conducting layer. Since the resistance value changes depending on the shape of the inner through-electrode 12 and that of the columnar semiconductors 11d, the shape thereof can be changed in accordance with a required resistance value or capacity value. In this manner, the region of the inner through-electrode 12 and the shape of the columnar semiconductors 11d is determined by a resistance value or capacity value. A reduction in the impedance of the through-electrode allows high-speed transfer between semiconductor chips.

FIGS. 7 and 8 each illustrate data showing effects of the above-described embodiment, the effects being obtained by the inventor of the present application. FIG. 7 shows the dependence of the through-electrode capacity upon the number of outer peripheral layers, and FIG. 8 shows the dependence of the through-electrode capacity upon the thickness of an insulating layer (oxide layer), in the presence and absence of an outer peripheral layer. Letting the capacity of the through-electrode without any outer peripheral be 1 as a reference value, the relative through-electrode capacity was advantageously reduced by a factor of 3 by using one outer peripheral layer, 5 by using two outer peripheral layers, and 6.5 by using five outer peripheral layers. As the result in FIG. 7 indicates, a rough capacity target (indicated by a dotted line in FIG. 7) of the through-electrode was substantially attained by using a single outer peripheral layer. FIG. 8 shows an oxidelayer thickness dependence of the through-electrode capacity when oxide film is used as an insulating layer. Herein, a solid line A indicates the case without any outer peripheral layer, and a solid line B indicates the case with one outer peripheral layer provided. Since the layer thickness dependence is reduced by the outer peripheral layer that has been brought into a floating state, the layer thickness of the insulating layer can be optionally selected within the range in which the withstand voltage of the insulating layer can be allowed, without the need to give importance to the capacity value.

The through-electrode according to this embodiment comprises the inner through-electrode and the outer peripheral layer in a floating state, arranged around the periphery thereof. Since the inner through-electrode includes therein the columnar semiconductors arranged in equal spacings, it can be formed of a thin conducting layer. Arranging the outer peripheral layer(s) allows the capacity between the semiconductor substrate and the inner through-electrode to be drastically reduced. Use of this structure provides a through-electrode that is small in capacity value and easily producible, and a three-dimensional semiconductor device having this through-electrode, capable of high-speed data transfer.

Second Embodiment

A production process of the three-dimensional semiconductor device according to the present invention will be described as a second embodiment thereof, with reference to FIGS. 9A to 9c and FIGS. 10A and 10B. Sectional views in FIGS. 9A to 9c and FIGS. 10A and 10B each show one of a plurality of the through-electrodes of the three-dimensional semiconductor device. Herein, the same components as those in the first embodiment are designated by the same reference numerals.

Figure 9A:
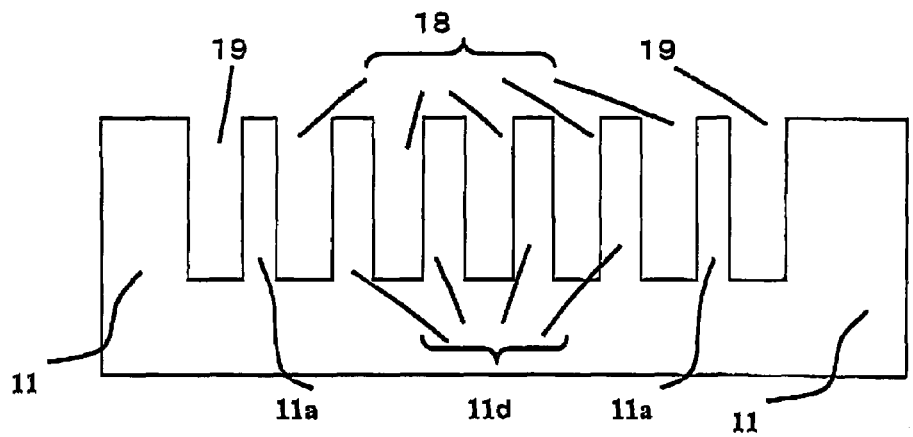
FIGS. 9A to 9C are each a sectional view showing a production process of the through-electrode having an outer peripheral layer in the present invention.

As shown in FIG. 9A, by applying lithography, etching, and the like to the semiconductor substrate 11, trenches 18 for the inner through-electrode 12 and trenches 19 for the outer through-electrode 14 are formed. Quadrangular ring-shaped semiconductor 11a and columnar semiconductors 11d are formed in the semiconductor substrate 11 by the trenches 18 and the trenches 19. The trenches 18 are formed to have equal widths, and the trenches 19 are formed into a size equal to or smaller than the trenches 18. Equalizing the widths of the trenches 18 allows the trenches 18 to be uniformly filled up with a conducting layer having the same thickness, and concurrently, the trenches 19 are also filled up.

Figure 9B:
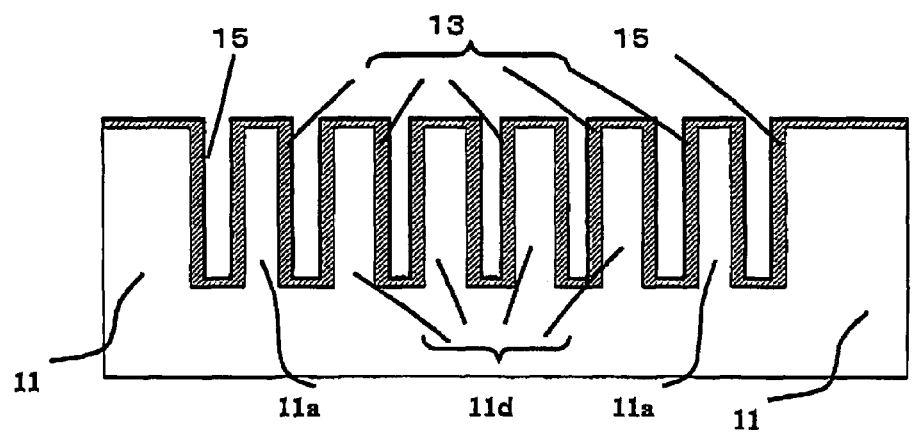

Next, as shown in FIG. 9B, an insulation layer is deposited over the entire surface of the semiconductor substrate 11. Out of the insulation layer formed over the entire semiconductor substrate, the insulating layer formed in the trenches 18 for use in the inner through-electrode 12 is referred to as an inner through-electrode insulating layer 13, while the insulating layer formed in the trenches 19 for use in the outer peripheral through-electrode 14 is referred to as an outer peripheral through-electrode insulating layer 15.

Figure 9C:
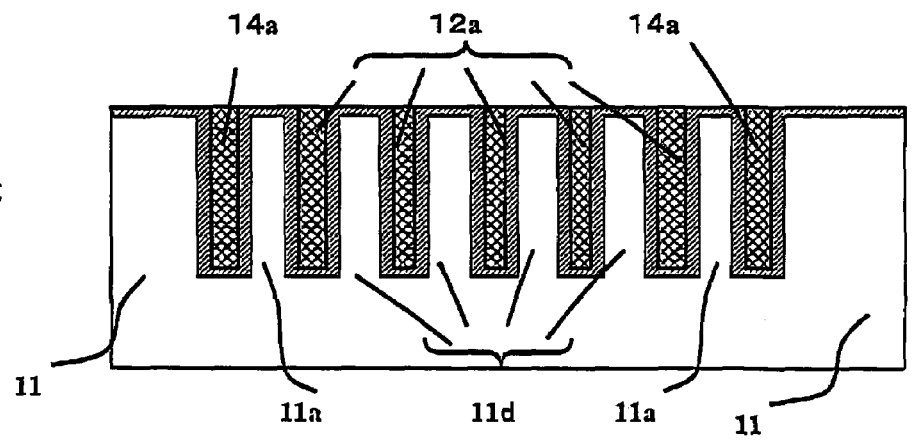

As shown in FIG. 9C, an conducting layer is formed over the entire surface of the semiconductor substrate 11 using the CVD method. In this manner, the trenches 18 for use in the inner through-electrode 12 and the trenches 19 for use in the outer peripheral through-electrode 14 are filled in with a conducting layer. In this event, since the trenches 18 are ones separated into a plurality at equal spacings by columnar semiconductors 11d, they can be filled in with a thin conducting layer. Formation of a thin conducting layer enables a conducting layer with a uniform layer quality to be provided. Out of the conducting layer formed over the entire semiconductor substrate, the conducting layer formed in the trenches 18 for use in the inner through-electrode 12 is referred to as an inner through conducting layer 12a, and the conducting layer formed in the trenches 19 for use in the outer peripheral through-electrode 14 is referred to as an outer peripheral through conducting layer 14a.

Thereafter, a flattening process is performed, and an inner through-electrode 12 and an outer peripheral through-electrode 14 are formed in the trenches. As a material for the conductor layer, polysilicon, tungsten, copper, or the like is used. The forming method for the conductor layer may include sputtering, plating, and the like besides the CVD method. Since the outer peripheral through-electrode 14 is used in a floating state, in which no potential is supplied thereto, the structure may be such that the trench 19 for use in the outer peripheral through-electrode 14 is reduced in size and entirely filled in with the insulating layer so as to form no conducting layer.

Figure 10A:
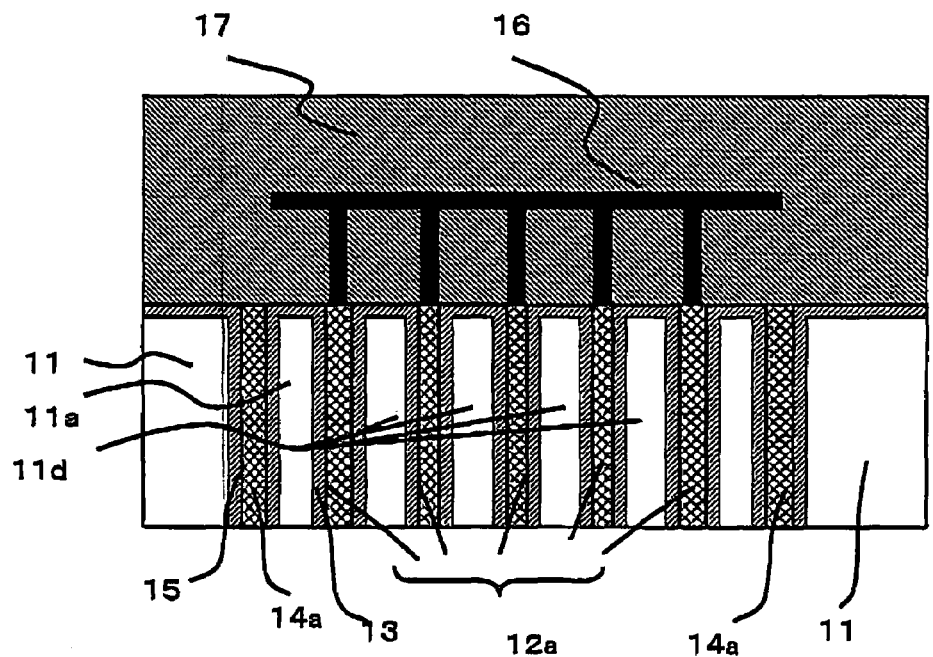
FIGS. 10A and 10B are each a sectional view showing a production process of the through-electrode having an outer peripheral layer in the present invention.
Figure 10B:
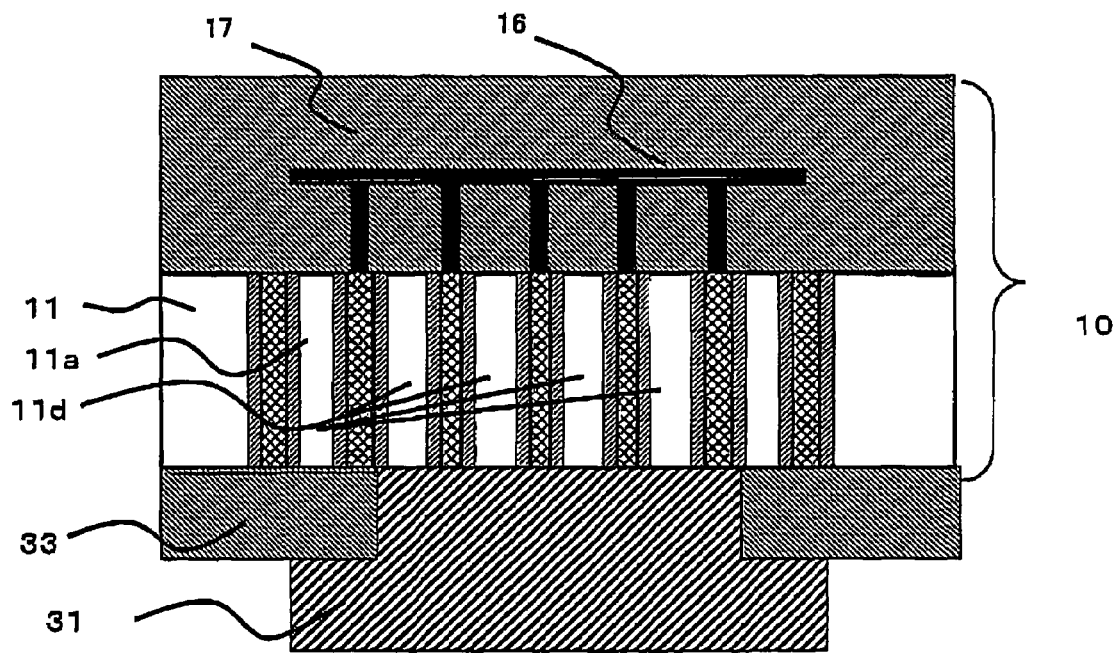

As shown in FIG. 10A, connection wiring 16 from the inner through-electrode 12, and an insulating layer 17 for protecting a chip are formed. At this time, transistor elements, capacity elements, and resistance elements are also formed, although not shown in the figure. The rear surface side of the semiconductor substrate 11 is ground until the time when the inner through-electrode 12 and the outer peripheral through-electrode 14 are exposed. Thus, the semiconductor substrate 11 is thinly formed. The rear-surface grinding of the semiconductor substrate 11 may also be conducted in two steps in which the grinding is first performed part way, and wet polishing or dry polishing is then applied.

On the rear surface of the semiconductor substrate 11 having subjected to the rear-surface grinding, an insulating layer 33 is formed, via holes for establishing connection with the inner through-electrode 12 are provided, and a bump 31 is formed. Thereafter, the semiconductor substrate 11 is divided into chips, each of which constitutes a semiconductor chip 10 with a through-electrode (refer to FIG. 10B). Herein, a bump has been formed on the rear surface side, but it may instead be formed on the surface side, and specifically, on the inner through-electrode 12 or on the connection wiring 16. Furthermore, the bump may also be formed on both of the surface and rear surface. As shown in FIG. 3, which illustrates the three-dimensional device according to the present invention, a semiconductor chip 10 with the bump 31 on the rear surface side, and a semiconductor chip 20 with the bump 32 on the surface side are connected, wherein the connection of both chips is established by the bump 31 of the semiconductor chip 10 and the bump 32 of the semiconductor chip 20. Herein, in order to ensure reliability and electrical characteristics of the semiconductor chips 10 and 20, it is desirable to seal the connection part between the semiconductor chips 10 and 20 by the resin adhesive 34.

In the above-described embodiment, the through-electrode has been used in the semiconductor chip on which transistor elements, capacity elements, or resistance elements are formed, but the through-electrode can also be used in an interposer or the like on which no transistor is formed.

As described above, the through-electrode and the semiconductor device can be formed by the production process of the present embodiment. The described features of the present invention make it possible to obtain a through-electrode that is small in the capacity value and easily producible, and a three-dimensional semiconductor device with this through-electrode, capable of high-speed data transfer.

Having described the invention related to its specific embodiments, it is to be understood that the invention is not limited thereto, but rather various changes and modifications may be made without departing from the spirit and scope of the invention. Furthermore, the above-described embodiments incorporate various aspects of the invention, and various aspects of the invention can be extracted from these embodiments by combining disclosed constituent features as appropriate. For example, any aspects of the invention that have predetermined effects even if the disclosed constituent features are cleared of some constituent features, can be extracted as an invention.

What is claimed is:

1. A through-electrode that penetrates a semiconductor substrate and that is insulatively separated from the semiconductor substrate, the through-electrode comprising:
    an inner through-electrode;
    a quadrangular ring-shaped semiconductor; and an outer peripheral through-electrode, wherein the quadrangular ring-shaped semiconductor is formed around the inner through-electrode, and the outer peripheral through-electrode is formed around the quadrangular ring-shaped semiconductor.

2. The through-electrode according to claim 1, wherein each of the quadrangular ring-shaped semiconductor and the outer peripheral through-electrode are in such a floating state that no potential is supplied.

3. The through-electrode according to claim 2, wherein the inner through-electrode, the quadrangular ring-shaped semiconductor, and the outer peripheral through-electrode are insulatively separated from one another by insulating layers.

4. The through-electrode according to claim 2, wherein:
    the inner through-electrode includes a columnar semiconductor and an inner through conducting layer;
    the columnar semiconductor has a square or rectangular cross-sectional shape;
    the columnar semiconductor is arranged with the same spacing between opposing sides of the quadrangular ring-shaped semiconductor and the columnar semiconductor; and
    the spaces between the opposing sides of the quadrangular ring-shaped semiconductor and the columnar semiconductor are filled in with the inner through conducting layer.

5. The through-electrode according to claim 2, wherein:
    the inner through-electrode includes a plurality of columnar semiconductors and an inner through conducting layer;
    each of the columnar semiconductors has a square or rectangular cross-sectional shape;
    the columnar semiconductors are arranged with the same spacing between opposing sides of the quadrangular ring-shaped semiconductor and the columnar semiconductors and between the adjacent columnar semiconductors; and
    the spaces between the opposing sides of the quadrangular ring-shaped semiconductor and the columnar semiconductors and between the adjacent columnar semiconductors are filled in with the inner through conducting layer.

6. The through-electrode according to claim 4, wherein the columnar semiconductor is insulatively separated from the inner through conducting layer by an inner through-electrode insulating layer.

7. The through-electrode according to claim 2, wherein the quadrangular ring-shaped semiconductor is insulatively separated from the inner through conducting layer by the inner through-electrode insulating layer, and insulatively separated from the outer peripheral through conducting layer by the outer peripheral through-electrode insulating layer.

8. The through-electrode according to claim 2, wherein the outer peripheral through-electrode includes the outer peripheral through conducting layer and the outer peripheral through-electrode insulating layer, and is insulatively separated from the quadrangular ring-shaped semiconductor and the semiconductor substrate by the outer peripheral through-electrode insulating layer.

9. The through-electrode according to claim 2, wherein a thickness of each of the outer peripheral through conducting layer and the outer peripheral through-electrode insulating layer that constitute the outer peripheral through-electrode, is smaller than a thickness of the respective one of the inner through conducting layer and the inner through-electrode insulating layer that constitute the inner through-electrode.

10. The through-electrode according to claim 2, further comprising:
    at least one outer peripheral layer arranged outside the outer peripheral through-electrode, the at least one outer peripheral layer including a quadrangular ring-shaped semiconductor and an outer peripheral through-electrode.

11. The through-electrode according to claim 1, wherein the inner through-electrode is connected to a bump directly, or indirectly via connection wiring.

12. A semiconductor device formed by stacking semiconductor chips, each of the semiconductor chips comprising:
   an inner through-electrode that penetrates a semiconductor substrate;
   a quadrangular ring-shaped semiconductor formed around the inner through-electrode; and
   an outer peripheral through-electrode formed around the outer periphery of the quadrangular ring-shaped semiconductor.

13. The semiconductor device according to claim 12, wherein each of the quadrangular ring-shaped semiconductor and the outer peripheral through-electrode are in such a floating state that no potential is supplied.

14. The semiconductor device according to claim 13, wherein the inner through-electrode includes a plurality of columnar semiconductors and an inner through conducting layer, and is insulatively separated from the quadrangular ring-shaped semiconductor by an inner through-electrode insulating layer.

15. The semiconductor device according to claim 13, wherein the plurality of columnar semiconductors is arranged with the same spacing between opposing sides of the quadrangular ring-shaped semiconductor and the columnar semiconductors or between the adjacent columnar semiconductors; and
   wherein the spaces between the opposing sides of the quadrangular ring-shaped semiconductor and the columnar semiconductors and between the adjacent columnar semiconductors are filled in with the inner through conducting layer.

16. The semiconductor device according to claim 13, wherein each of the columnar semiconductors is insulatively separated from the inner through conducting layer by the inner through-electrode insulating layer.

17. The semiconductor device according to claim 13, further comprising:
   at least one outer peripheral layer arranged outside the outer peripheral through-electrode, the at least one outer peripheral layer including a quadrangular ring-shaped semiconductor and an outer peripheral through-electrode.

18. The semiconductor device according to claim 12,
   wherein the inner through-electrode is connected to a bump directly, or indirectly via connection wiring; and
   wherein the semiconductor chips are stacked by the bump.

19. The through-electrode according to claim 5, wherein the columnar semiconductor is insulatively separated from the inner through conducting layer by an inner through-electrode insulating layer.

* * * * *